(12) United States Patent
Scanlan et al.

(10) Patent No.: US 8,826,221 B2
(45) Date of Patent: Sep. 2, 2014

(54) ADAPTIVE PATTERNING FOR PANELIZED PACKAGING

(71) Applicant: DECA Technologies Inc., Tempe, AZ (US)

(72) Inventors: Christopher M. Scanlan, Chandler, AZ (US); Timothy L. Olson, Phoenix, AZ (US)

(73) Assignee: DECA Technologies Inc., Tempe, AZ (US)

( * ) Notice: Subject to any disclaimer, the term of this patent is extended or adjusted under 35 U.S.C. 154(b) by 0 days.

(21) Appl. No.: 13/893,117

(22) Filed: May 13, 2013

(65) Prior Publication Data

US 2013/0249088 A1 Sep. 26, 2013

Related U.S. Application Data

(63) Continuation of application No. 12/876,915, filed on Sep. 7, 2010.

(60) Provisional application No. 61/305,125, filed on Feb. 16, 2010.

(51) Int. Cl.
| | |
|---|---|
| *G06F 17/50* | (2006.01) |
| *G01R 31/26* | (2014.01) |
| *H01L 21/66* | (2006.01) |
| *H01L 23/02* | (2006.01) |
| *H01L 23/04* | (2006.01) |
| *H01L 23/00* | (2006.01) |
| *H01L 23/52* | (2006.01) |
| *H01L 23/522* | (2006.01) |
| *H01L 21/768* | (2006.01) |
| *H01L 23/544* | (2006.01) |

(52) U.S. Cl.
CPC ......... *H01L 22/12* (2013.01); *H01L 2224/2105* (2013.01); *H01L 24/19* (2013.01); *H01L 2224/12105* (2013.01); *H01L 2224/131* (2013.01); *G96F 17/5077* (2013.01); *H01L 2224/14131* (2013.01); *H01L 23/52* (2013.01); *H01L 23/5226* (2013.01); *H01L 23/544* (2013.01); *H01L 24/20* (2013.01); *H01L 21/768* (2013.01); *H01L 22/20* (2013.01); *H01L 2224/221* (2013.01); *H01L 2223/54473* (2013.01); *H01L 2223/54426* (2013.01)
USPC ............ 716/138; 716/119; 438/14; 257/686; 257/698

(58) Field of Classification Search
None
See application file for complete search history.

(56) References Cited

U.S. PATENT DOCUMENTS

| | | |
|---|---|---|
| 5,359,496 A | 10/1994 | Kornrumpf et al. |
| 5,465,217 A | 11/1995 | Yip et al. |
| 6,249,047 B1 | 6/2001 | Corisis |
| 6,392,301 B1 | 5/2002 | Waizman et al. |
| 6,433,419 B2 | 8/2002 | Khandros et al. |
| 6,655,011 B1 | 12/2003 | Kornrumpf et al. |
| 6,836,023 B2 | 12/2004 | Joshi et al. |
| 6,851,100 B1 | 2/2005 | You et al. |
| 7,078,272 B2 | 7/2006 | Ho et al. |
| 7,659,622 B2 | 2/2010 | Dauksher et al. |
| 7,725,862 B2 | 5/2010 | Hummler |
| 7,772,696 B2 | 8/2010 | Hunter |

(Continued)

*Primary Examiner* — A. M. Thompson
(74) *Attorney, Agent, or Firm* — Booth Udall Fuller, PLC

(57) ABSTRACT

An adaptive patterning method and system for fabricating panel based package structures is described. Misalignment for individual device units in a panel or reticulated wafer may be adjusted for by measuring the position of each individual device unit and forming a unit-specific pattern over each of the respective device units.

20 Claims, 11 Drawing Sheets

(56) References Cited

U.S. PATENT DOCUMENTS

| | | |
|---|---|---|
| 7,928,563 B2 | 4/2011 | Bakir et al. |
| 7,979,813 B2 | 7/2011 | Rumsey et al. |
| 8,004,095 B2 | 8/2011 | Shim et al. |
| 8,053,279 B2 | 11/2011 | Farnworth et al. |
| 8,084,871 B2 | 12/2011 | Rahim et al. |
| 2001/0020735 A1 | 9/2001 | Chikawa et al. |
| 2003/0066040 A1 | 4/2003 | Morgan |
| 2003/0090006 A1 | 5/2003 | Farnworth |
| 2003/0124868 A1 | 7/2003 | Mizukoshi |
| 2004/0032013 A1 | 2/2004 | Cobbley et al. |
| 2004/0049912 A1 | 3/2004 | Akagawa et al. |
| 2005/0248022 A1 | 11/2005 | Badr et al. |
| 2006/0168552 A1 | 7/2006 | Farnworth et al. |
| 2007/0249067 A1 | 10/2007 | Hedler et al. |
| 2008/0136004 A1 | 6/2008 | Yang et al. |
| 2008/0178127 A1 | 7/2008 | Dewkett et al. |
| 2008/0230889 A1 | 9/2008 | Standing |
| 2008/0237828 A1 | 10/2008 | Yang |
| 2008/0288908 A1 | 11/2008 | Hart et al. |
| 2009/0057888 A1 | 3/2009 | Hunter |
| 2010/0180249 A1 | 7/2010 | Rumsey et al. |
| 2010/0203676 A1* | 8/2010 | Theuss et al. ............ 438/109 |
| 2010/0230795 A1 | 9/2010 | Kriman et al. |
| 2010/0301474 A1 | 12/2010 | Yang |
| 2011/0074041 A1 | 3/2011 | Leung |
| 2011/0108981 A1 | 5/2011 | Rahim et al. |
| 2011/0154277 A1 | 6/2011 | Ankenbauer et al. |
| 2011/0202896 A1 | 8/2011 | Scanlan et al. |

* cited by examiner

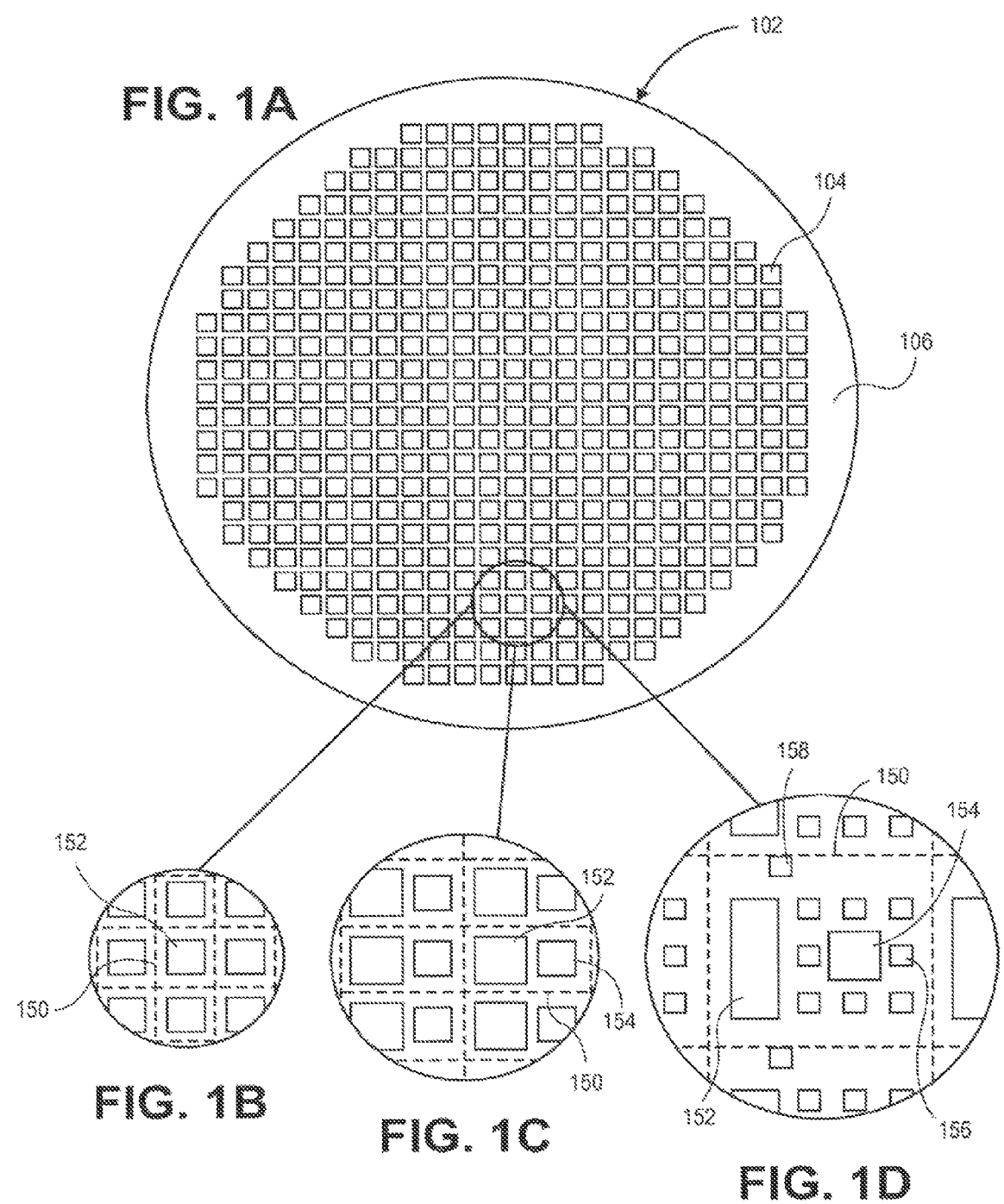

ADAPTIVE PATTERNING FOR PANELIZED PACKAGING

RELATED APPLICATIONS

This application is a continuation application of U.S. Pat. No. 12/876,915, titled "Adaptive Patterning for Panelized Packaging," filed Sep. 7, 2010, and also claims the benefit of U.S. Provisional Application No. 61/305,125, filed Feb. 16, 2010, the disclosures of which are hereby incorporated herein by this reference.

TECHNICAL FIELD

Embodiments of the present disclosure relate to the field of panelized packaging.

BACKGROUND

A common implementation of panelized packaging gaining acceptance in industry is fan-out wafer level packaging (WLP) in which multiple die units are placed face down on a temporary tape carrier. The carrier is overmolded with epoxy molding compound using a compression molding process. After molding the carrier tape is removed, leaving the active surface of the multiple die exposed in a structure commonly referred to as a reconstituted wafer. Subsequently, a wafer level chip scale package (WLCSP) build-up structure is formed on top of the reconstituted wafer. Ball grid array (BGA) balls are attached to the reconstituted wafer and then the reconstituted wafer is saw singulated to form individual packages. It has been observed that the die placement and overmolding processes may cause displacement and/or rotation of the die, resulting in defective packages and yield loss.

BRIEF DESCRIPTION OF THE DRAWINGS

FIG. 1A illustrates a top view of a reconstituted wafer in accordance with an embodiment of the present invention.

FIGS. 1B-1D illustrate a top view of a plurality of packages or modules arranged in a reconstituted wafer in accordance with embodiments of the present invention.

DETAILED DESCRIPTION

Figure 2A:
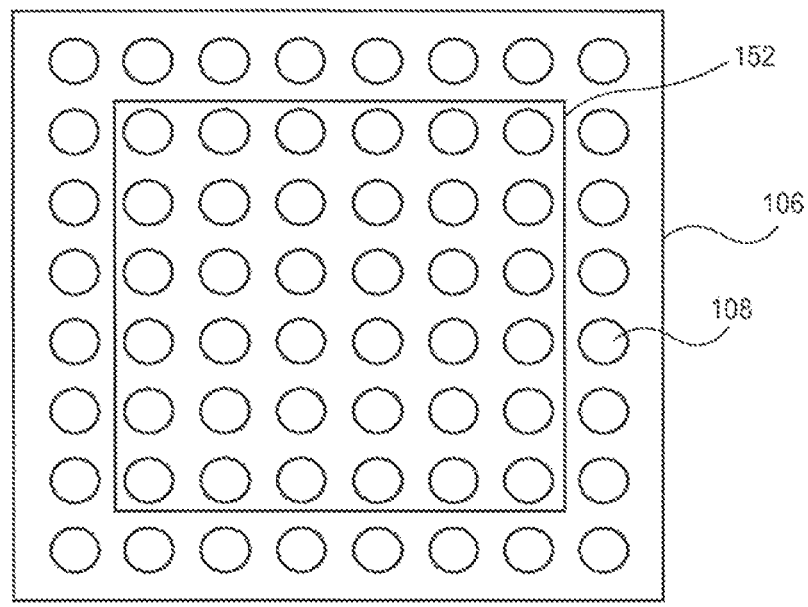
FIG. 2A illustrates a top view of a fan-out WLP in accordance with an embodiment of the present invention.

Embodiments of the present invention disclose methods and systems to improve panelized packaging. In accordance with embodiments of the present invention, misalignment for individual device units in a panel or reticulated wafer may be adjusted for by measuring the misalignment for each individual device unit and adjusting the position or design of a feature in the build-up layer for each respective device unit utilizing a mask-less patterning technique.

In the following description, numerous specific details are set forth, such as specific configurations, compositions, and processes, etc., in order to provide a thorough understanding of the present invention. In other instances, well-known processes and manufacturing techniques have not been described in particular detail in order to not unnecessarily obscure the present invention. Furthermore, it is to be understood that the various embodiments shown in the Figures are illustrative representations and are not necessarily drawn to scale.

The terms "over," "between," and "on" as used herein refer to a relative position of one layer with respect to other layers. One layer deposited or disposed above or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

In accordance with embodiments of the present invention, a plurality of device units may be assembled and molded to create a panel, or reticulated wafer. Device units may be active device units such as dies, and may also be passive device units such as an integrated passive network, or a discrete passive device unit such as a capacitor, resistor, or inductor. The device units may be pre-packaged, though pre-packaging is not required. In accordance with embodiments of the present invention, the pre-packages may contain single or a plurality of device units and other components. The panel is inspected to measure the true position for each device unit in the panel. For example, the measured position may include an x-y position and/or orientation of at least one feature from each device unit with respect to a global fiducial(s) on the panel. A unit-specific pattern for each individual device unit is then created based upon the measured position for each respective individual device unit, and provided to a laser, direct write imaging system or other mask-less patterning system. The unit-specific patterns are then formed over each of the plurality of device units so that each unit-specific pattern is aligned with the respective device unit.

In an embodiment, creating the pattern relates to adjusting the position or design of a unit detail pattern in a chip scale package (CSP) build-up structure to align with the measured position of each device unit in the panel. In an embodiment, the unit detail pattern is a first via pattern, a capture pad, or an interconnecting trace pattern which may or may not be associated with a redistribution layer (RDL). For example, the position of a first via pattern can be adjusted so that it is formed in alignment with the measured position of each device unit in the panel. Also, an RDL layer, including at least a capture pad for the first via may be adjusted or designed to maintain alignment with the true position of each device unit in the panel. The final under bump metallurgy (UBM) pad and BGA ball may be formed without aligning with respect to the measured position of the device unit. As such, the UBM pad and BGA ball may be aligned consistently with respect to the package outline for each device unit, maintaining conformance to the package outline.

Adaptive patterning may also be utilized to create a plurality of module-specific patterns across the panel. In accordance with embodiments of the present invention, a plurality of device units and optionally other components may be assembled and molded to create a panel, or reticulated wafer. The other components may be optical elements, connectors (e.g. to connect to the outside of the module) and other electronic components, which may also be pre-packaged. In an embodiment, a module includes a plurality of device units. A module may also include at least one device unit and another component. A panel including a plurality of arrangements of a plurality of device units, or at least one device unit and at least one additional component is inspected to measure the true position for each device unit and optional other component in the panel. For example, the measured position may include an x-y position and/or orientation of at least one feature from each device unit and optional other component within a module with respect to a global fiducial(s) on the panel. A module-specific pattern for each module is then created based upon the measured position for each respective individual device unit and optional other component within the respective module, and provided to a laser, direct write imaging system or other mask-less patterning system. The module-specific patterns are then formed over each of the plurality of device units and optional other components so that each module-specific pattern is aligned with the respective module device units and optional other components.

Creating the module-specific pattern may relate to adjusting the position or design of a unit or component detail pattern in a CSP build-up structure to align with the measured position of each device unit or component in the panel as previously described with regard to the single device unit package embodiment. Where multiple devices and optional other components exist, device interconnect traces which may or may not be associated with a RDL may exist. A multi-layer build-up structure can also be utilized for both modules as well as single device packages.

Referring to FIG. 1A, in an embodiment, the process begins with a panel 102 including a plurality of device units 104 overmolded with an encapsulating material 106 such as an epoxy resin. While FIG. 1A illustrates a circular panel 102, alternative panel formats such as rectangular or square may be utilized. As illustrated in FIG. 1A, the active surfaces of the plurality of device units 104 are substantially flush with the encapsulating material 106. In an embodiment, panel 102 may be what is known in the art as a reconstituted wafer formed in a WLP technique where the plurality of device units are placed face down on a temporary tape carrier, followed by overmolding with epoxy molding compound using a compression molding process, followed by removal of the temporary tape carrier leaving the active surfaces of the plurality of die units exposed.

Subsequently, a build-up structure may be formed on top of the structure illustrated in FIG. 1A and the device units are singulated to form packages or modules. For example, as illustrated in FIG. 1B, the panel may be singulated into a plurality of single-die packages 150, each package including a single semiconductor die unit 152. Referring to FIG. 1C, a plurality of die units 152, 154 may be mounted within the molded panel and singulated to form multi-die packages or modules 150. Referring to FIG. 1D, a single die unit 152 or a plurality of die units 152, 154 may be mounted within the molded panel with the addition of a passive device(s) 156 (such as capacitor, inductor or resistor) and/or other component(s) 158 (such as an optical element, connector or other electronic component) and singulated to form a packages or modules 150 which include both an active device(s) and a passive device(s) and/or other component 158. A variety of combinations of active and passive devices and optionally other components within packages or modules are envisioned in accordance with embodiments of the present invention. Accordingly, the particular configurations illustrated in FIGS. 1B-1D are meant to be illustrated rather than limiting.

In the following discussion, certain embodiments are described with regard to the formation of a single die fan-out WLCSP, though embodiments of the invention are not limited to such. Embodiments of the present invention may be used in any panelized packaging application including single-die applications, multi-die modules, some combination of a die(s) and a passive component(s) within a module, or some combination of a device unit(s) and another component(s) within a module. In one aspect, embodiments of the present invention may eliminate or reduce package or module assembly yield loss caused by misalignment of the device unit or other component during panelization. In another aspect, embodiments of the present invention may maintain compliance to the package or module outline and not require changes to the position of UBM pads or BGA balls. Maintaining compliance with the package or module outline can be consistently achieved in the final product, e.g. as end-product package, test socket, etc. In another aspect, embodiments of the present invention may allow for a smaller bond pad opening on the device units.

Figure 2B:
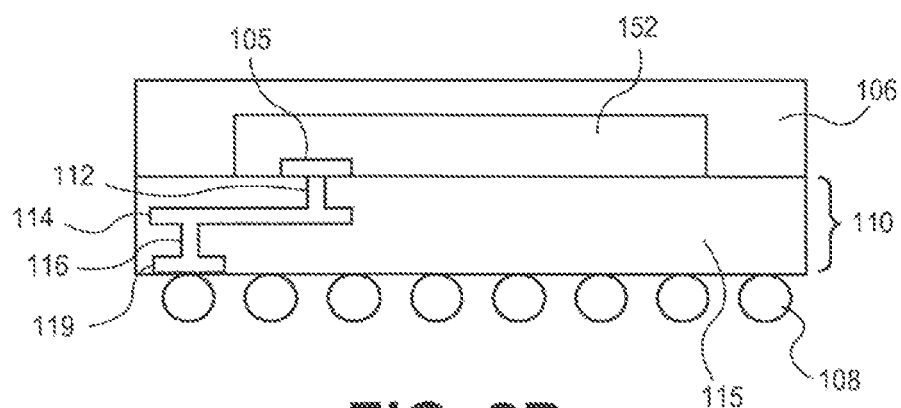
FIG. 2B illustrates a cross-sectional side view of a fan-out WLP in accordance with an embodiment of the present invention.

Referring now to FIGS. 2A-2B, ball grid array (BGA) balls 108 are attached and the panel is saw singulated to form individual packages. The CSP build-up structure 110 may be formed over the active surface of each individual die unit before singulation. While build-up structure 110 in FIG. 2B is illustrated as including a single dielectric layer 115, it is understood that multiple layers may be used to form build-up structure 110. Build-up structure 110 may be formed from a dielectric material 115 within which is included a first via 112 which is in electrical contact with a bond pad 105 of the die unit 152. A redistribution layer (RDL) 114 is formed which may span under the bond pad 105, first vial 12, and over an underbump metallurgy (UBM) via 116, UBM pad 119, and BGA ball 108. BGA ball 108 is illustrated in FIG. 2B as a solder ball, though is not limited to such. In other embodiments, multiple dielectric layers and device interconnect traces, which may or may not be associated with the RDL, are formed in accordance with the principles described herein. Such multi-layer build-up structures can be utilized in both single-die package applications as well as multi-device modules.

Figure 3A:
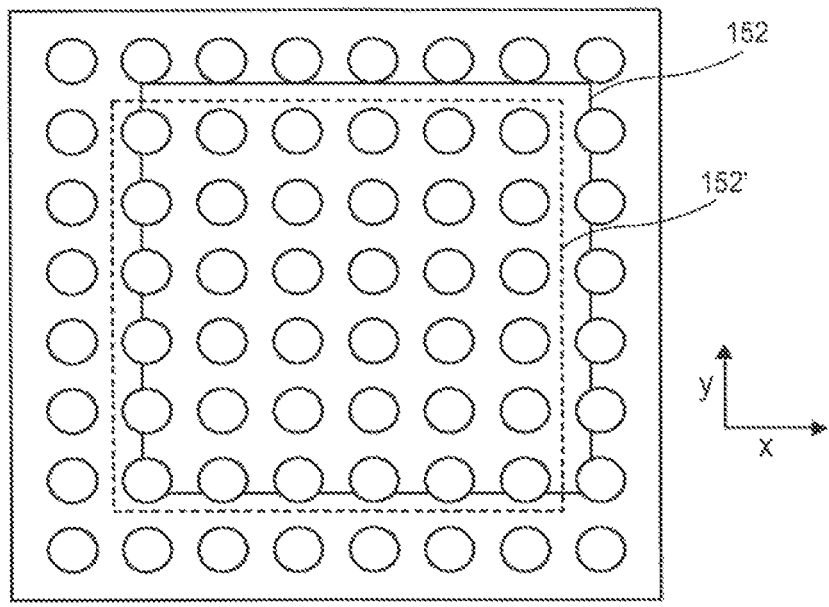
FIG. 3A illustrates a top view of the actual position of a package die having a different x-y position than that of the nominal, reference position in accordance with an embodiment of the present invention.
Figure 3B:
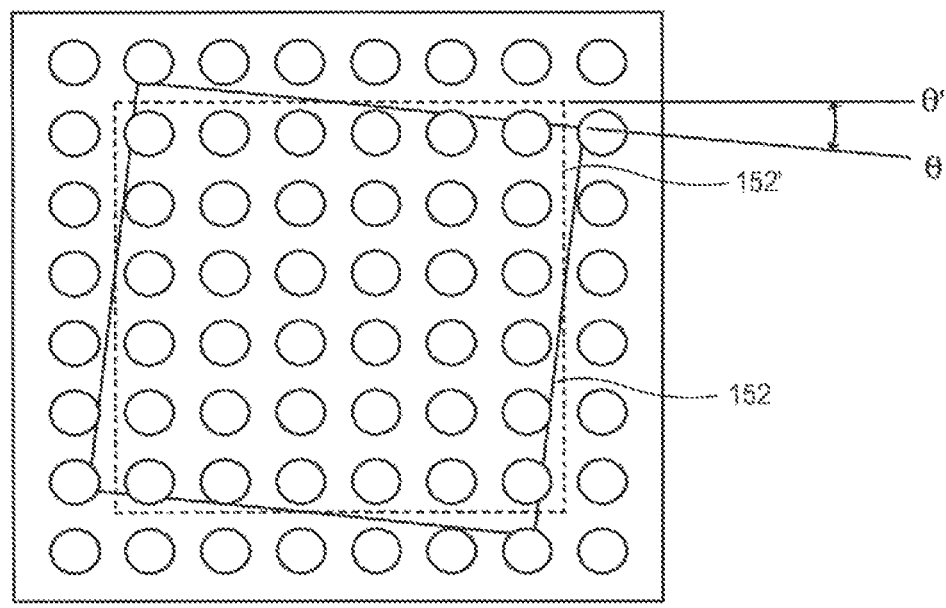
FIG. 3B illustrates a top view of the actual position of a package die having a different orientation than that of the nominal, reference orientation in accordance with an embodiment of the present invention.

It has been observed that die unit placement and overmolding may cause displacement and/or rotation of the orientation of any of the plurality of die units 152 on the temporary tape carrier. This may be attributed to the die units not being rigidly attached to the temporary tape carrier as well as shrinkage of the molding compound during curing of the molding compound. As a result, the plurality of die units 152 on panel 102 may not lie in their nominal, reference positions after compression molding. As illustrated in FIG. 3A, the actual position of a die unit 152 may have a different x-y position than that of the nominal, reference position 152' of the die unit. As illustrated in FIG. 3B, the actual position of the die unit 152 may be rotated such that it has a different orientation θ than that of the nominal, reference orientation θ' of the nominal, reference position 152'. While the difference in x-y position and orientation is illustrated in FIGS. 3A-3B with respect to the nominal, reference positions of the die unit within an individual singulated package outline, it is understood that the difference in x-y position and orientation may be actually measured with regard to a global fiducial(s) within the panel or reticulated wafer.

Misalignment of the individual die units may cause some of the packages which are subsequently singulated from the panel to be defective. Conventional methods for forming a CSP build-up structure on a panel utilize mask-based patterning technologies to expose a pattern on multiple die units of the panel at the same time. The masks include fixed patterns for die pad to UBM interconnect and, therefore, lack the ability to adjust for the movement of each die within a panelized format. The impact of the conventional methods is either yield loss due to misalignment of first vias to the bond pads or the addition of some intermediate form of die pad re-routing in native wafer form (prior to panelization) to make larger die pads as targets to ensure the first vias make connection despite die movement. As a result, conventional processing technology requires that bond pads on the die units be larger than necessary to avoid yield loss from the panel, thereby reducing the application space for WLP technology.

In accordance with embodiments of the present invention, misalignment of the individual die units is adjusted for by utilizing an adaptive patterning technique which additionally implements mask-less lithography to pattern features of the build-up structure 110. Laser ablation and direct write exposure are examples of suitable mask-less patterning techniques in accordance with embodiments of the present invention.

In an embodiment, a panel including a plurality of die units is provided as illustrated in FIG. 1A. A true position is measured for each of the plurality of die units 152 of the panel. The measurement may be of a specific feature formed on each of the die units of the panel. For example, the position of at least one bond pad 105 on each of the plurality of die units on the panel can be measured. The specific position can be a variety of positions, such as a corner of the bond pad 105, a center of the bond pad, an outline of the bond pad, etc. Included in the position measurement may be the x-y position and/or orientation with respect to a global fiducial(s) on the panel. Any suitable inspection tool may be utilized to measure the true first position, such as an optical inspection tool. In an embodiment, a single feature is measured to obtain an x-y position of a die unit. In an embodiment, a plurality of features are measured to obtain an orientation of a die unit.

A build-up structure 110 is formed over the panel including the plurality of die units. Referring again to FIG. 2B, a singulated package is illustrated with a completed build-up structure 110. While the build-up structure 110 is illustrated as being formed over a single package in FIG. 2B, it is understood that build-up structure 110 is formed prior to singulation, and that a plurality of build-up structures 110 are formed across the panel 102 and over each of the respective plurality of die units 152 on the panel 102 illustrated in FIG. 1A.

In an embodiment, the build-up structure 110 is formed from a dielectric material 115, from which features are patterned. Build-up structure 110 may include a plurality of layers. For example, a separate dielectric layer may be formed in which the first via 12, RDL pattern 114, and UBM via 116, and/or UBM pad 119 are separately formed. In an embodiment, there may be multiple via and RDL patterned layers. Dielectric material 115 may be opaque or translucent, and different materials can be utilized for the separate dielectric layers. Where the dielectric material 115 is opaque, optical measurements of a feature may be measured prior to forming the dielectric material 115 over the underlying feature. Where the dielectric material 115 is translucent it is possible to measure the position of a feature below the dielectric material 115 before or after forming the dielectric material over the panel.

Based upon the true measured position for each of the respective die units, a specific pattern is created for each of the plurality of die units. The pattern is unit-specific for each of the respective die units, and therefore the unit-specific patterns may be different (e.g. x-y position, orientation, design) for each respective die unit so that each unit-specific pattern is aligned with each respective die unit, thereby compensating for misalignment of the individual die units. Each unit-specific pattern may be a common pattern aligned with the respective die unit. Each unit-specific pattern may also be uniquely created for each die unit in accordance with embodiments of the present invention.

Figure 4:
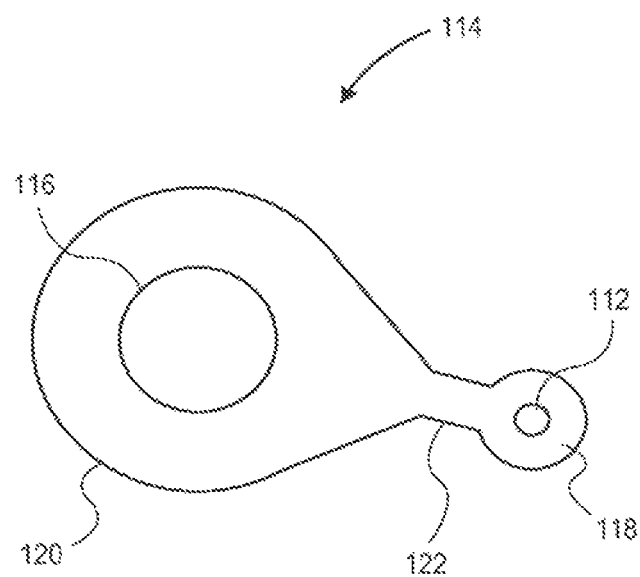
FIG. 4 illustrates an RDL pattern in accordance with an embodiment of the present invention.

The pattern is then formed over each of the plurality of die units. In an embodiment, the pattern is a unit detail pattern formed in a build-up structure 110 such as the first via 112 which connects the bond pad 105 to the RDL pattern 114, the RDL pattern 114, or the UBM pad pattern 119. As illustrated in FIG. 4, the RDL pattern 114 of FIG. 2B may include a first via capture pad 118 aligned with the first via 112, a UBM via capture pad 120 aligned with the UBM via 116, and a trace portion 122 connecting the capture pads 121, 120. The patterned features in the build-up structure 110 may be formed utilizing a mask-less patterning system. For example, a first via 112 or RDL pattern 114 may be created through exposure of a photoimagable polymer or photoresist through a direct writing. First via 112 or RDL pattern 114 may also be created through laser ablation of dielectric material 115.

A number of methods are envisioned for creating a pattern for each of the plurality of die units based upon the measured position for each of the respective die units. In an embodiment, this may be accomplished by comparing the measured position of each of the plurality of die units to a number of defined nominal, reference positions. For example, a nominal, reference position of at least one feature on each of the plurality of die units can be defined with respect to a global fiducial(s) on the panel 102. The specific nominal, reference position can be a variety of positions, such as a corner of the bond pad 105, a center of the bond pad, an outline of the bond pad, an alignment feature, etc. The specific nominal, reference position can also be the package outline, within which the die units will be packaged. Multiple features for each unit may be used in order to determine the orientation of the die within the unit. Included in the nominal, reference position may be the x-y position and/or orientation with respect to a global fiducial(s) on the panel. In an embodiment, defining a nominal, reference position includes generating an electronic panel map. For example, the nominal, reference position (x-y position and/or orientation) of each die unit in the panel can be defined in an electronic panel map. Though embodiments do not require a panel map, and the nominal, reference positions can be provided elsewhere.

In an embodiment, the position or design of the pattern is adjusted for each die unit to align with the measured position of the respective die unit in the panel. Design software can create a pattern design for each of the plurality of die units based upon the measured position of each of the die units in the panel. This pattern design may then be stored in a panel design file, in which the x-y position and/or orientation of the pattern is adjusted. The pattern may also be changed to optimize the pattern design for each die unit. The panel design file may be transferred to a mask-less patterning system to form at least the unit-specific pattern.

Figure 5A:
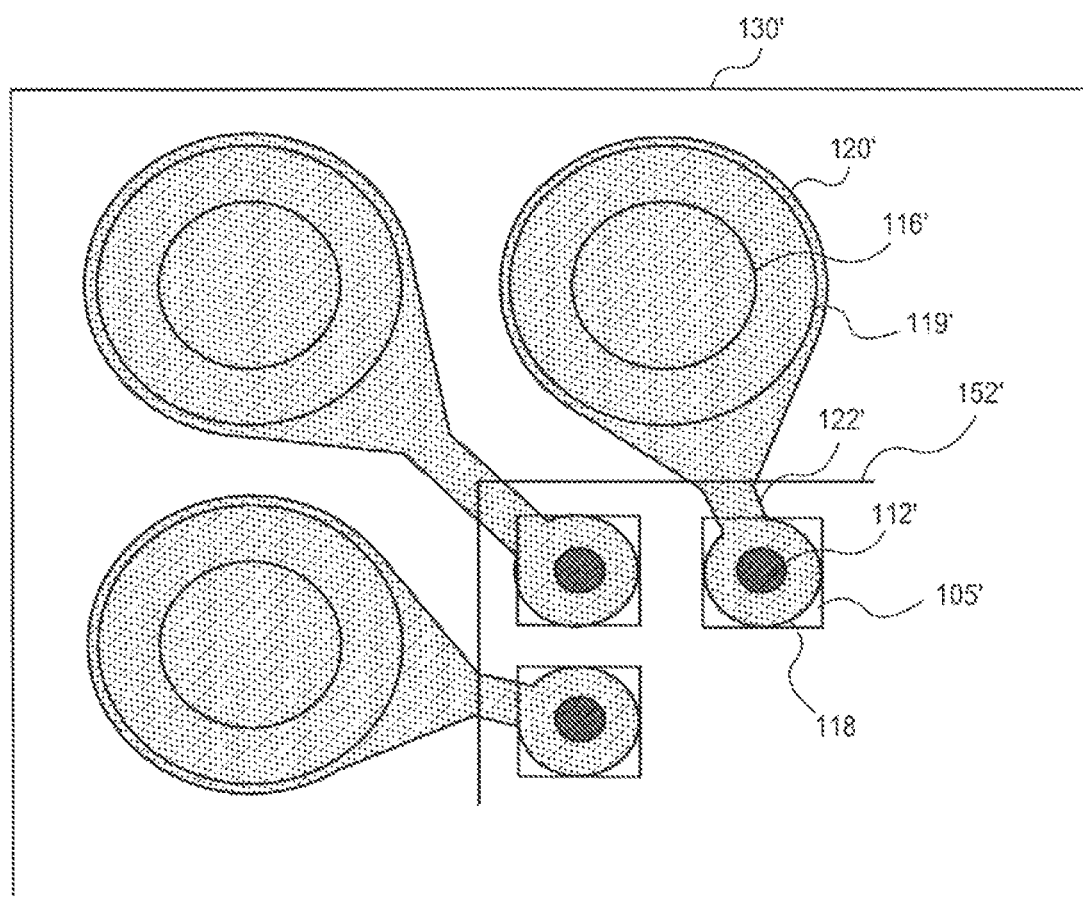
FIG. 5A illustrates a portion of panel design in accordance with an embodiment of the present invention.

FIG. 5A illustrates a portion of a panel design in accordance with an embodiment of the present invention. The illustration provided in FIG. 5A is meant to be exemplary of a panel design in accordance with an embodiment of the present invention and is not meant to be limiting. As illustrated, an upper left-hand corner of an individual package outline is shown, however it is understood that the panel design may include additional or less information for the individual die package, and that the panel design may include similar information for each of the plurality of die units of the panel.

As illustrated in FIG. 5A, the panel design may define nominal, reference positions for each die within the panel, as well as nominal, reference positions for yet to be formed features. In an embodiment, the nominal, reference positions for the die 152' and bond pad 105' are defined. Features which have not yet been formed over the panel may include nominal, reference positions for the first via 112', die via capture pad 118', UBM via 116', UBM via capture pad 120', RDL pattern trace 122', UBM pad 119', and package outline 130' of a package to be singulated from the panel.

Figure 5B:
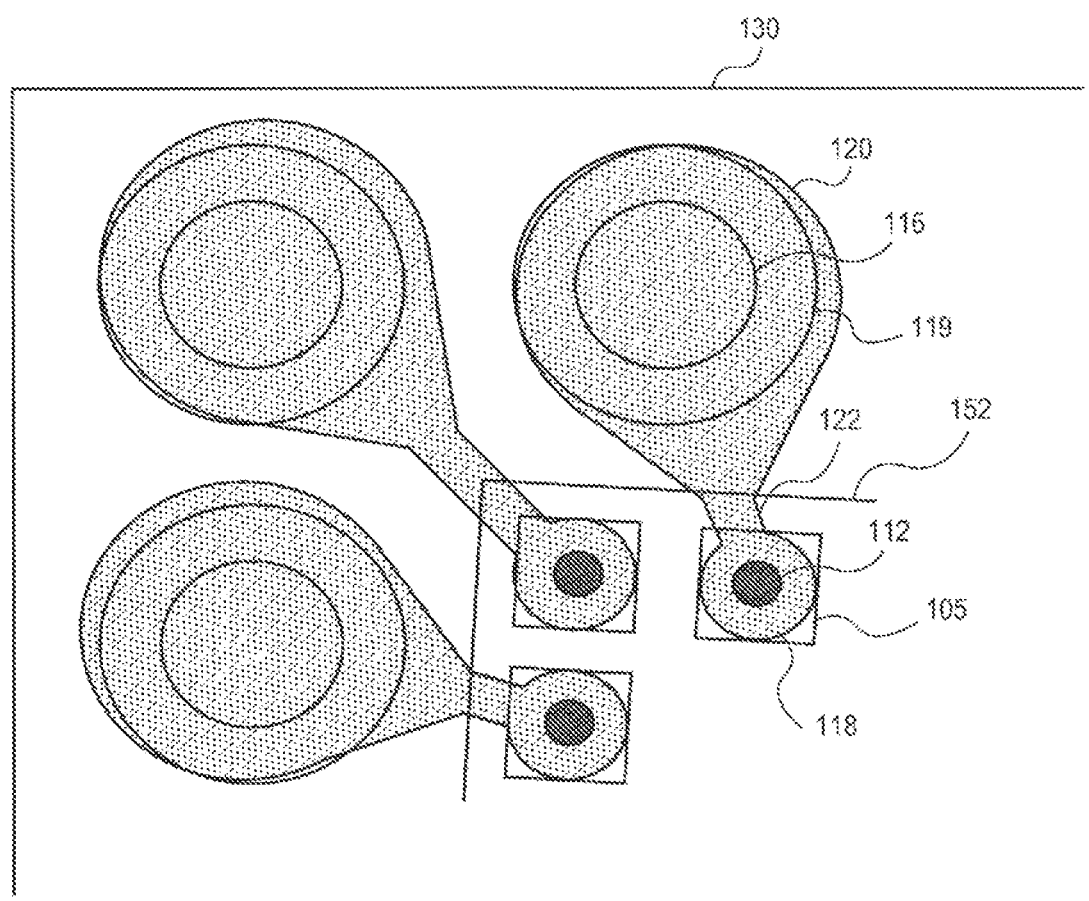
FIG. 5B illustrates a misaligned die unit in accordance with an embodiment of the present invention.

FIG. 5B illustrates a misaligned die unit in accordance with an embodiment of the present invention. As illustrated, die unit 152 is illustrated as being misaligned with respect to the nominal, reference die unit position 152' or global fiducial(s) on the panel (not illustrated). Likewise, the already formed die pad 105 is illustrated as being misaligned with respect to the nominal, reference die unit position 105' or global fiducial(s) on the panel (not illustrated).

In an embodiment, a nominal, reference position of at least one feature on each of the plurality of die units is defined. For example, the nominal, reference position may be die pad 105'. The true position of the die bond pad 105 is measured for each of the plurality of die units on the panel. In accordance with embodiments of the invention, misalignment of the individual die units is determined when the measured position of the die bond pad 105 has a different x-y position or orientation than that of the reference position of the die bond pad 105'.

In an embodiment, the position of the patterned feature (e.g. first via 112, die via capture pad 118, UBM via 116, UBM via capture pad 120, RDL pattern trace 122) formed in the CSP build-up structure 110 has a different x-y position or orientation than the nominal, reference position of the feature for at least one of the plurality of die units. In an embodiment, the formed first via 112 has a different x-y position as compared to the reference position of the first via 112' for at least one of the plurality of die units. In an embodiment, the formed RDL pattern 114 has a different x-y position as compared to the reference position of the RDL pattern 114' for at least one of the plurality of die units. In an embodiment, the formed RDL pattern 114 has a different x-y position and orientation as compared to the reference position of the RDL pattern 114' for at least one of the plurality of die units.

In an embodiment, the amount of misalignment of the die unit in the x-y direction and/or orientation is measured by the inspection tool, and a delta-value between the nominal, reference position and measured position of the die unit is calculated for at least one of the plurality of die units. Based upon the delta-value, the pattern to be formed is created by adjusting the pattern from its reference position by the same delta-value. It is contemplated, however, that the patterned feature may not necessarily have to be formed with the same delta-value in accordance with embodiments of the invention.

Other embodiments of the present invention may maintain the relative alignment of certain features within the end package. In the embodiment illustrated in FIG. 5B, it is shown that the relative alignment between the first via 112, and the bond pad 105 and die unit 152 is the same as the relative alignment illustrated in FIG. 5A between the nominal, reference positions 112', 105', 152'. In an embodiment, any of the portions 118, 122, 120 of the RDL pattern 114, or the entire RDL pattern 114 may be shifted in FIG. 5B by the same delta-value between the true first position of the bond pad 105 and the reference bond pad position 105'.

In an embodiment, an additional feature may be formed over each of the plurality of die units without regard to the measured position of each of the respective plurality of die units. In accordance with embodiments of the present invention UBM pad 119 is formed at the nominal, reference position 119' without regard to the measured position of each of the respective plurality of die units. In the embodiment illustrated in FIG. 5B, position of the actual positions of the UBM pad 119 and package outline 130 are the same as the corresponding nominal, reference positions 108', 130'. As illustrated, the actual position UBM via 116 may also be in the position as the nominal, reference position 116'.

Figure 6A:
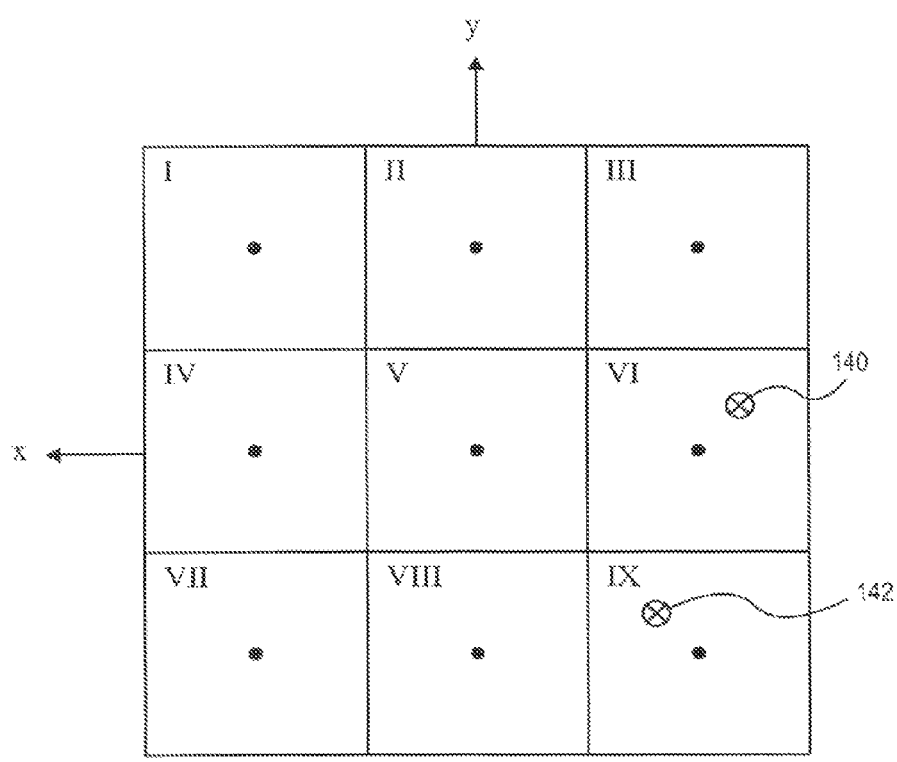
FIG. 6A illustrates a discrete plurality of different design options in accordance with an embodiment of the present invention.

Adjusting the position of a unit detail pattern formed in the CSP build-up structure to align with the measured position of each die in the panel may also include changing the RDL pattern design. In an embodiment, changing the RDL pattern design includes selecting a best-fit RDL pattern design from a discrete plurality of different design options. An illustration of a discrete plurality of different design options is provided in FIG. 6A. For example, each quadrant I-IX represents a range of delta-values between the measured position of the bond pad 105 and the reference bond pad position 105'. By way of example, if the delta-value corresponds to point 140 in FIG. 6A, then the RDL pattern design for quadrant VI is selected. If the delta-value corresponds to point 142 in FIG. 6A, then the RDL pattern for quadrant IX is selected. In this manner the design tool can automatically generate a given best-fit pattern for each individual die based upon the corresponding delta-value for that specific die. For example each of the different design patterns associated with the quadrants can have different sizes, shapes, and/or orientations for the RDL pattern. While FIG. 6A illustrates a nine different design options, it is to be understood that any discrete number of different design options may be used.

In application, several variations are envisioned in accordance with embodiments of the present invention. For example, the manner of adjusting a unit detail pattern formed in the CSP build-up structure may depend upon the amount of adjustment required to align the unit detail pattern with the respective die in the panel. In a first level operation, where the delta-value is minimal, it is contemplated that adjustment of the first via 112 position may be sufficient to compensate for misalignment of the die 152. In a first variation, if the reference first via capture pad 118' no longer sufficiently overlaps the adjusted first via 112 position, then all or a portion of the RDL pattern 114 position may need to be adjusted by the same delta-value by which the first via 112 position was adjusted. In a second variation, where adjustment of the RDL pattern 114 position is not adequate, the design of the RDL pattern 114 may be changed so that the first via capture pad 118 is aligned to the first via 112, and the UBM via capture pad 120 is aligned with the UBM via 116. This may be accomplished by selecting a best-fit design of the RDL pattern 114 for each of the respective die units based upon the position of the delta-value in the quadrants illustrated in FIG. 6A, or dynamically designing a customized RDL pattern 114 for each die unit.

Figure 6B:
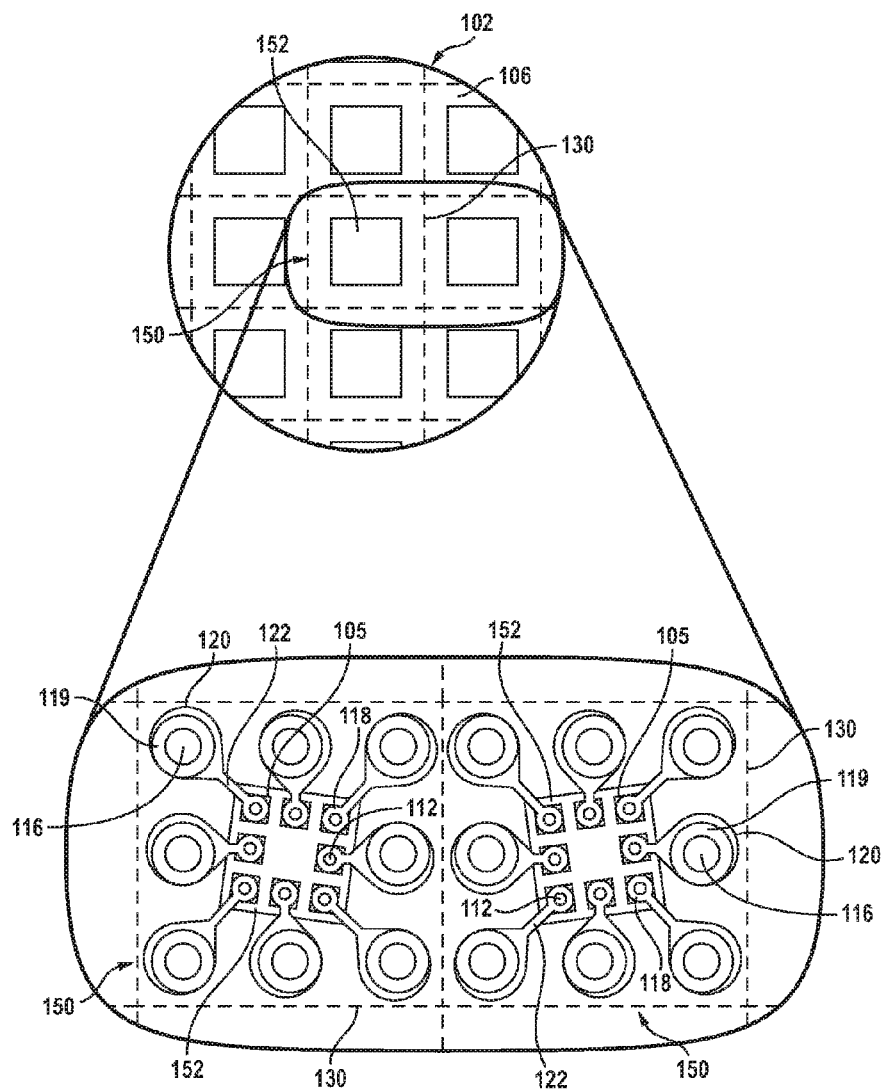
FIG. 6B illustrates a plurality of semiconductor packages that include a first misalignment and a second misalignment in accordance with an embodiment of the present invention.

As described above, and as shown in FIG. 6B, for example, an adaptive patterning technique in accordance with embodiments of the present invention may be utilized to pattern features within a build-up structure 100, such as a first via 112 and RDL pattern 114. In an embodiment, an adaptive patterning technique may be utilized for any structure within the build-up structure. For example, build-up structure may contain multiple layers, vias, and RDL patterns. In an embodiment, an adaptive patterning technique may include measurement of a first true position followed by adaptive patterning of a first via and RDL-1, then measurement of a second true position followed by adaptive patterning of a via-2 and RDL-2, then measurement of true position 'n' followed by adaptive patterning of a via-n and RDL-n.

In an embodiment, adjusting the position of a unit detail pattern formed in the CSP build-up structure to align with the measured position of each die in the panel includes changing the RDL pattern design with a dynamic design approach. For example, a customized RDL pattern may be dynamically generated for each specific die unit based upon the corresponding delta-values for each specific die unit.

In accordance with embodiments of the present invention, the first via 112 may be adjusted for each individual die to compensate for misalignment of the respective die 152. Therefore, the statistical average across the lot for the misalignment of the first via 112 relative to the respective die 152 outline is considerably less than the statistical average of the misalignment of the die 152 relative to the package outline 130. These relationships can be represented as follows:

$$\Delta_{(avg, lot)}(112, 152) \ll \Delta_{(avg, lot)}(152, 130)$$

In an embodiment, the statistical average across the lot for the misalignment of the first via 112 relative to the respective die 152 outline is nil.

$$\Delta_{(avg, lot)}(112, 152) = 0$$

In accordance with embodiments of the present invention, a lot of die packages may be singulated from a panel or reticulated wafer. The lot may be characterized by a unique statistical range of relative orientations. In conventional processes, where a plurality of die are misaligned across the panel, the statistical average across the lot for the misalignment of the first via 112 relative to the respective die 152 outline for the lot is directly proportional to the statistical average of the misalignment of the die 152 relative to the package outline 130. These relationships can be represented as follows:

$$\Delta_{(avg, lot)}(112,152) \approx \Delta_{(avg, lot)}(152,130)$$

In accordance with embodiments of the present invention, the first via 112 may be adjusted for each individual die to compensate for misalignment of the respective die 152. Therefore, the statistical average across the lot for the misalignment of the first via 112 relative to the respective die 152 outline is considerably less than the statistical average of the misalignment of the die 152 relative to the package outline 130. These relationships can be represented as follows:

$$\Delta_{(avg, lot)}(112,152) \ll \Delta_{(avg, lot)}(152,130)$$

In an embodiment, the statistical average across the lot for the misalignment of the first via 112 relative to the respective die 152 outline is nill.

$$\Delta_{(avg, lot)}(112,152) = 0$$

Certain embodiments may be implemented as a computer program product that may include instructions stored on a non-transitory machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

The digital processing devices described herein may include one or more general-purpose processing devices such as a microprocessor or central processing unit, a controller, or the like. Alternatively, the digital processing device may include one or more special-purpose processing devices such as a digital signal processor (DSP), an application specific integrated circuit (ASIC), a field programmable gate array (FPGA), or the like. In an alternative embodiment, for example, the digital processing device may be a network processor having multiple processors including a core unit and multiple microengines. Additionally, the digital processing device may include any combination of general-purpose processing devices and special-purpose processing devices.

Figure 7:
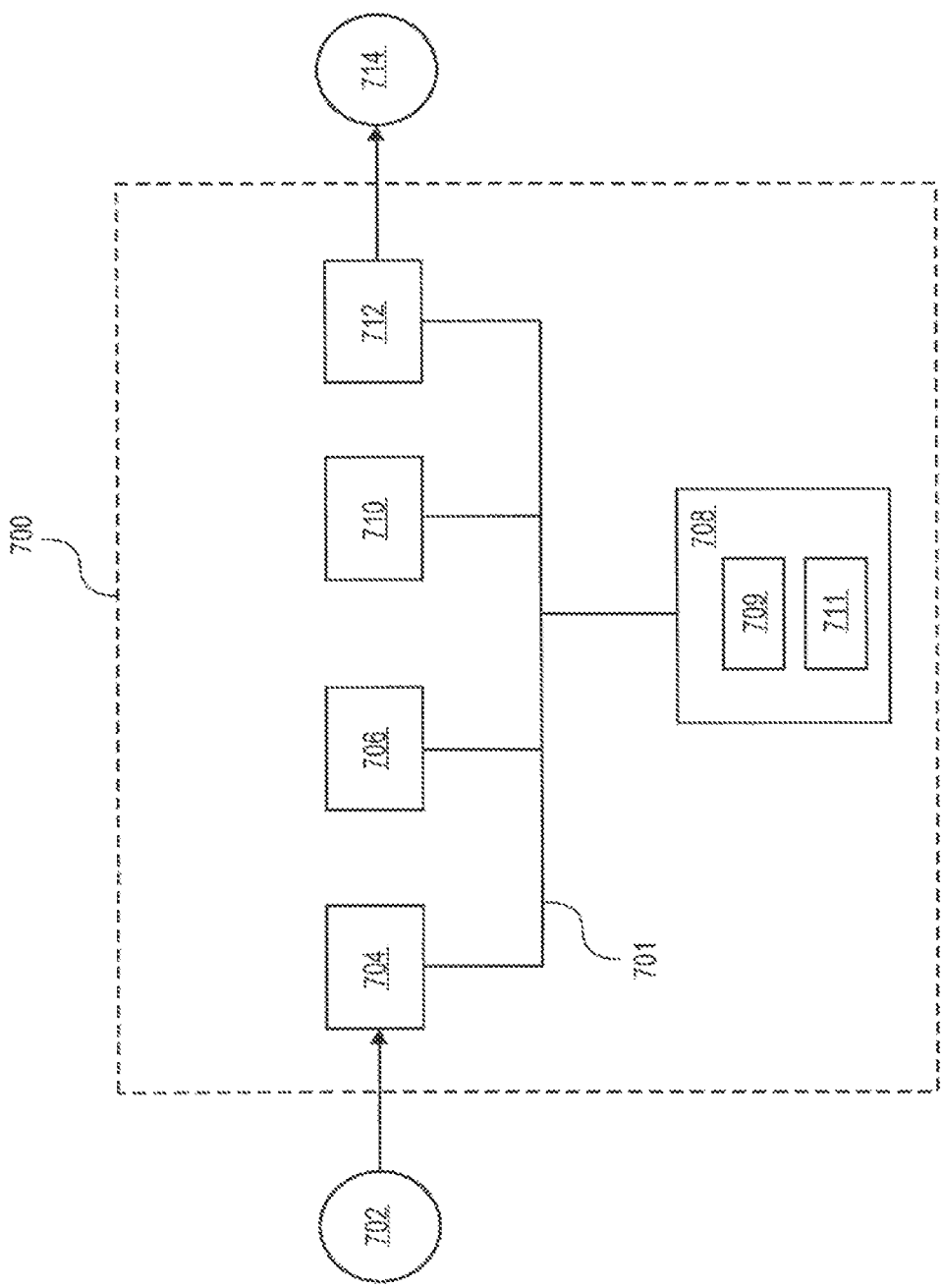
FIG. 7 illustrates an adaptive patterning system in accordance with an embodiment of the present invention.

Embodiments of the present invention may be performed with an adaptive patterning system 700 as illustrated in FIG. 7. Operations may be performed by hardware components, software, firmware, or a combination thereof. Any of the signals provided over various buses 701 described herein may be time multiplexed with other signals and provided over one or more common buses. As illustrated, a panel or reticulated wafer 702 may be supplied to an inspection tool 704 which measures a position of a plurality of device units on the panel and creates a file 706 containing the measured position of each of the plurality of device units. Design software stored on server 708 then creates a pattern design file 710 for each of the plurality of device units based upon the measured position of each of the plurality of device units. A patterning machine 712 imports the pattern design and forms a patterned feature over each of the plurality of device units. The panel or reticulated wafer 702 is provided to a patterning machine 712 from the inspection tool 704. A patterned panel 714 may be output from the patterning machine 712.

In an embodiment, the design software further creates a new drawing for at least one layer of design, which is adjusted such that the first via and/or RDL pattern is aligned to the measured position of each of the plurality of device units. In an embodiment, the software includes an algorithm for adaptive patterning. For example, the algorithm may adjust the x-y position or orientation of a feature based upon a delta-value. In an embodiment, the algorithm may select a feature pattern from a discrete number of design options based upon a delta-value. In an embodiment, the algorithm may dynamically design a feature based upon a delta-value.

The schematic illustration provided in FIG. 7 is indicative of the order of a process in accordance with embodiments of the invention, however, it is not necessary that the actual equipment be arranged as illustrated. As illustrated, the design software is stored on a separate server 708, which can also store a panel map which includes nominal, reference positions of the plurality of device units on the panel. It is not required that the design software be stored on a separate server 708. For example, design software could be stored on the inspection tool 704 or patterning machine 712. It is possible to have all components integrated into a single system.

Server 708 can be utilized to control any part of or the entire adaptive patterning system 700. In an embodiment, server 708 includes memory 711 having instructions stored thereon, which when executed by a processor 709, cause the processor to instruct the inspection tool 704 to measure a position of each of a plurality of device units of a panel, create a unit-specific pattern for each of the respective plurality of device units based upon the measured position for each of the respective device units, and instruct the patterning tool 712 to form the unit-specific patterns over each of the plurality of device units, wherein each unit-specific pattern is aligned with the respective device unit. In an embodiment, creating a unit-specific pattern for each of the respective plurality of device units based upon the measured position for each of the respective device units may include adjusting an x-y position and/or orientation of at least one unit-specific pattern, selecting from a discrete number of design options, or dynamically generating the unit-specific pattern.

Figure 8A:
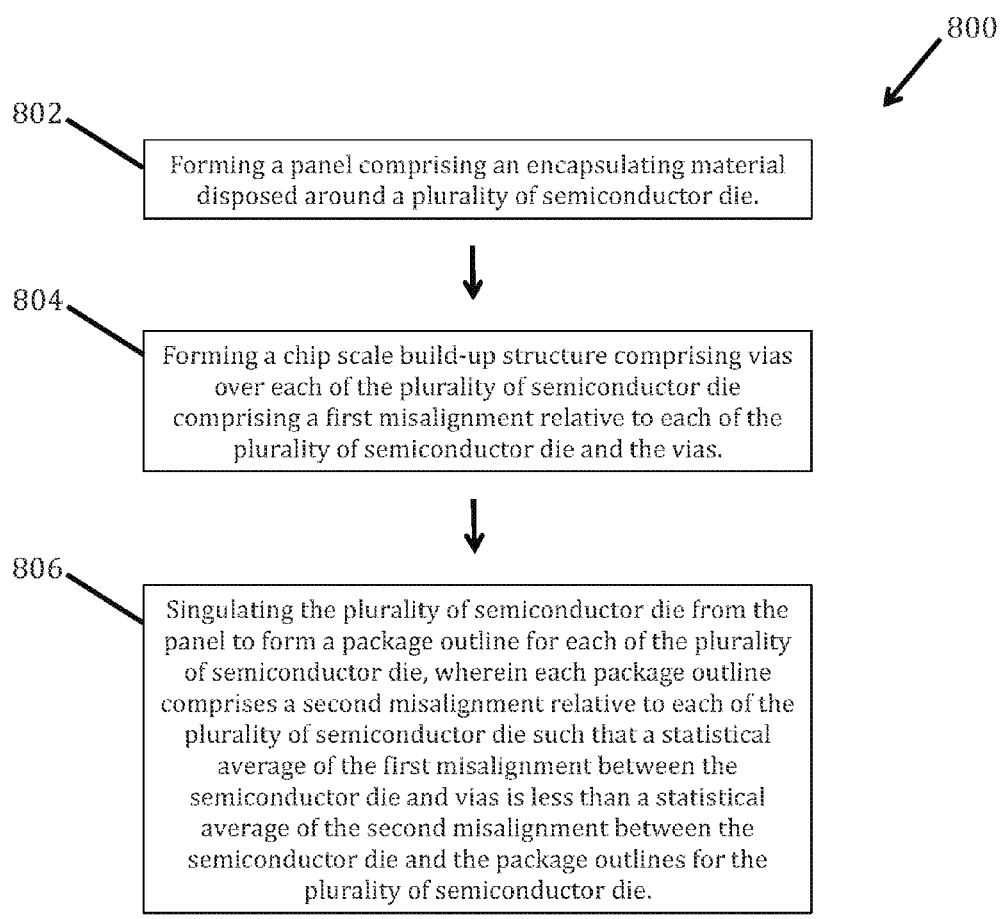
FIGS. 8A and 8B illustrate method diagrams of embodiments of adaptive patterning methods.

The method diagram provided in FIG. 8A illustrates a particular embodiment of an adaptive patterning method 800 comprising forming a panel comprising an encapsulating material disposed around a plurality of semiconductor die (step 802), forming a chip scale build-up structure comprising vias over each of the plurality of semiconductor die comprising a first misalignment relative to each of the plurality of semiconductor die and the vias (step 804), and singulating the plurality of semiconductor die from the panel to form a package outline for each of the plurality of semiconductor die, wherein each package outline comprises a second misalignment relative to each of the plurality of semiconductor die such that a statistical average of the first misalignment between the semiconductor die and vias is less than a statistical average of the second misalignment between the semiconductor die and the package outlines for the plurality of semiconductor die (step 806).

Figure 8B:
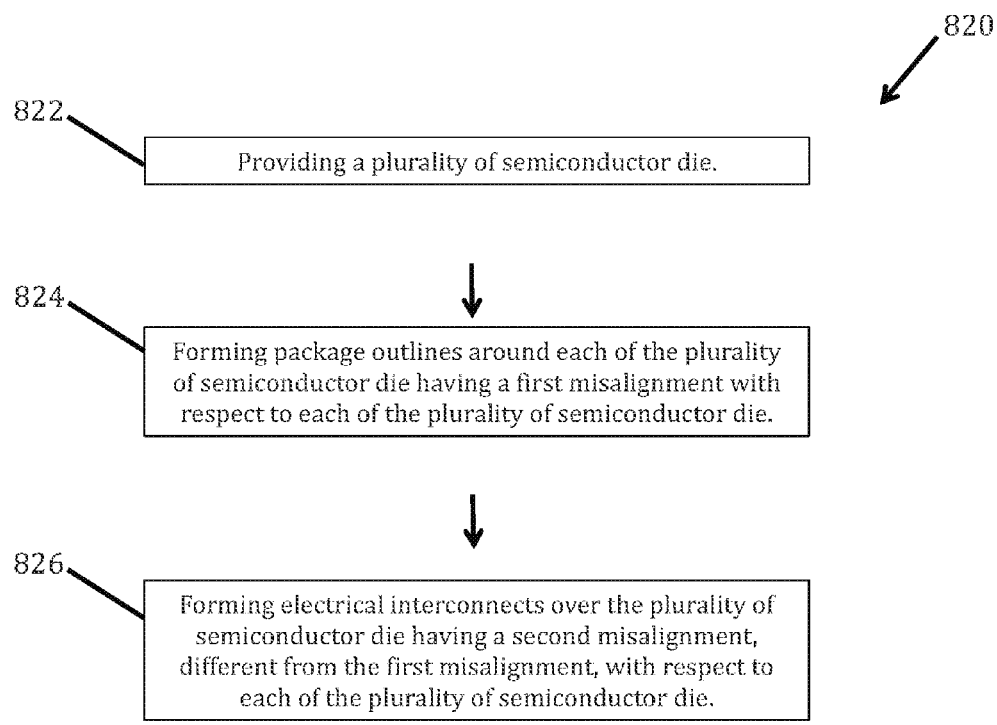

The method diagram provided in FIG. 8B illustrates a particular embodiment of an adaptive patterning method 820 comprising providing a plurality of semiconductor die (step 822), forming package outlines around each of the plurality of semiconductor die having a first misalignment with respect to each of the plurality of semiconductor die (step 824), and forming electrical interconnects over the plurality of semiconductor die having a second misalignment, different from the first misalignment, with respect to each of the plurality of semiconductor die (step 862).

The methods illustrated in FIGS. 8A and 8B may be implemented as non-transitory computer-readable storage medium having instructions stored thereon, which, when executed by a processor, cause the processor to perform an adaptive patterning method operation.

In the foregoing specification, various embodiments of the invention have been described. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method of making a plurality of semiconductor packages, comprising:
   forming a panel comprising an encapsulating material disposed around a plurality of semiconductor die;
   forming a chip scale build-up structure comprising vias over each of the plurality of semiconductor die comprising a first misalignment relative to each of the plurality of semiconductor die and the vias; and
   singulating the plurality of semiconductor die from the panel to form a package outline for each of the plurality of semiconductor die, wherein each package outline comprises a second misalignment relative to each of the plurality of semiconductor die such that a statistical average of the first misalignment between the semiconductor die and vias is less than a statistical average of the second misalignment between the semiconductor die and the package outlines for the plurality of semiconductor die.

2. The method of claim 1, further comprising forming the plurality of semiconductor die to include a lot of semiconductor die.

3. The method of claim 1, wherein forming the chip scale build-up structure comprising vias comprising the first misalignment includes forming the first misalignment with a statistical average of zero for each of the plurality of semiconductor die.

4. The method of claim 1, further including forming the package outlines with the second misalignment with respect to a feature of each of the plurality of semiconductor die.

5. The method of claim 1, further including forming the chip-scale build-up structure comprising the first misalignment with respect to at least one of a bond pad, a copper pillar and a feature on each of the plurality of semiconductor die.

6. The method of claim 1, further including measuring misalignments with respect to a point on an edge of the package outlines.

7. The method of claim 1, further including forming the panel as a reconstituted wafer.

8. A method of making a plurality of semiconductor packages, comprising:
   providing a plurality of semiconductor die;
   forming package outlines around each of the plurality of semiconductor die having a first misalignment with respect to each of the plurality of semiconductor die; and
   forming electrical interconnects over the plurality of semiconductor die having a second misalignment, different from the first misalignment, with respect to each of the plurality of semiconductor die; and
   forming the second misalignment with respect to a feature on each of the plurality of semiconductor die.

9. The method of claim 8, wherein providing the plurality of semiconductor die includes providing a lot of semiconductor die.

10. The method of claim 8, further including measuring misalignments with respect to a point on an edge of the package outlines.

11. The method of claim 8, wherein forming the electrical interconnects includes forming conductive vias.

12. The method of claim 8, wherein forming the first misalignment includes providing the plurality of semiconductor die with a unique statistical range of relative orientations.

13. The method of claim 8, wherein a statistical average for the first misalignment is not directly proportional to a statistical average of the second misalignment.

14. A plurality of semiconductor packages, comprising:
   a plurality of semiconductor die;
   a plurality of package outlines disposed around each of the plurality of semiconductor die that have a first misalignment with respect to each of the plurality of semiconductor die; and
   a plurality of electrical interconnects disposed over the plurality of semiconductor packages that have a second misalignment, different from the first misalignment, with respect to each of the plurality of semiconductor die;

wherein the first misalignment is formed with respect to each of the plurality of package outlines and an outline of each of the plurality of semiconductor die.

15. The plurality of semiconductor packages of claim 14, wherein a statistical average of the second misalignment for the plurality of semiconductor die is less than a statistical average of the first misalignment for the plurality of semiconductor die.

16. The plurality of semiconductor packages of claim 14, wherein the plurality of semiconductor die includes a lot of semiconductor die.

17. The plurality of semiconductor packages of claim 14, wherein the second misalignment includes a statistical average of zero for each of the plurality of semiconductor die.

18. The plurality of semiconductor packages of claim 14, wherein the second misalignment is formed with respect to at least one of a bond pad, a copper pillar and a feature on each of the plurality of semiconductor die.

19. The plurality of semiconductor packages of claim 14, wherein the misalignments are formed with respect to a point on an edge of each of the plurality of package outlines.

20. The plurality of semiconductor packages of claim 14, wherein the plurality of electrical interconnects include conductive vias.

* * * * *